(12) United States Patent
Buhay et al.

(10) Patent No.: US 7,232,615 B2
(45) Date of Patent: Jun. 19, 2007

(54) COATING STACK COMPRISING A LAYER OF BARRIER COATING

(75) Inventors: Harry Buhay, Allison Park, PA (US); James J. Finley, Pittsburgh, PA (US); James P. Thiel, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 400 days.

(21) Appl. No.: 10/816,519

(22) Filed: Apr. 1, 2004

(65) Prior Publication Data

US 2004/0247929 A1    Dec. 9, 2004

Related U.S. Application Data

(63) Continuation-in-part of application No. 10/422,095, filed on Apr. 24, 2003, now Pat. No. 6,962,759, which is a continuation-in-part of application No. 10/397,001, filed on Mar. 25, 2003, which is a continuation-in-part of application No. 10/133,805, filed on Apr. 25, 2002, which is a continuation-in-part of application No. 10/007,382, filed on Oct. 22, 2001, now Pat. No. 6,869,644.

(60) Provisional application No. 60/376,000, filed on Apr. 25, 2002.

(51) Int. Cl.
B32B 7/02 (2006.01)
B32B 9/00 (2006.01)
B32B 15/00 (2006.01)
B32B 9/04 (2006.01)
B32B 19/00 (2006.01)

(52) U.S. Cl. ............... 428/621; 428/615; 428/632; 428/432; 428/428; 428/433; 428/446; 428/701; 428/702; 428/704; 428/212

(58) Field of Classification Search ............ 428/621, 428/627, 632, 432, 428, 433, 212, 434, 446, 428/701, 702, 704

See application file for complete search history.

(56) References Cited

U.S. PATENT DOCUMENTS

| | | | |
|---|---|---|---|
| 3,083,551 A | 4/1963 | Pilkington | 65/32 |
| 3,220,816 A | 11/1965 | Pilkington | 65/99 |
| 3,281,296 A | 10/1966 | Jameson | 156/404 |
| 3,459,526 A | 8/1969 | Stickel et al. | 65/289 |
| 3,476,540 A | 11/1969 | Ritter, Jr. et al. | 65/107 |
| 3,527,589 A | 9/1970 | Ritter, Jr. | 65/289 |
| 3,660,061 A | 5/1972 | Donley et al. | 65/32 |
| 3,769,133 A | 10/1973 | Halberschmidt et al. | 156/286 |
| 3,843,346 A | 10/1974 | Edge et al. | 65/65 A |
| 4,017,661 A | 4/1977 | Gillery | 428/412 |
| 4,081,934 A | 4/1978 | Franz | 51/171 |
| 4,111,150 A | 9/1978 | Donley et al. | 118/7 |
| 4,197,108 A | 4/1980 | Frank et al. | 65/273 |
| 4,265,650 A | 5/1981 | Reese et al. | 65/104 |
| 4,272,272 A | 6/1981 | Grubka | 65/1 |
| 4,272,274 A | 6/1981 | Frank et al. | 65/273 |
| 4,379,040 A | 4/1983 | Gillery | 204/192 P |
| 4,504,109 A | 3/1985 | Taga et al. | 350/1.6 |
| 4,508,556 A | 4/1985 | Bennett et al. | 65/25.4 |
| 4,579,577 A | 4/1986 | Claassen | 65/273 |
| 4,584,206 A | 4/1986 | Sleighter | 427/109 |
| 4,610,771 A | 9/1986 | Gillery | 204/192.1 |
| 4,661,139 A | 4/1987 | Reese et al. | 65/106 |
| 4,716,086 A | 12/1987 | Gillery et al. | 428/630 |
| 4,719,126 A | 1/1988 | Henery | 427/165 |
| 4,719,127 A | 1/1988 | Greenberg | 427/165 |
| 4,746,347 A | 5/1988 | Sensi | 65/94 |
| 4,769,291 A | 9/1988 | Belkind et al. | 428/630 |
| 4,786,563 A | 11/1988 | Gillery et al. | 428/630 |
| 4,792,536 A | 12/1988 | Pecoraro et al. | 501/70 |
| 4,806,220 A | 2/1989 | Finley | 204/192.27 |
| 4,820,902 A | 4/1989 | Gillery | 219/203 |
| 4,830,650 A | 5/1989 | Kelly | 65/106 |
| 4,834,857 A | 5/1989 | Gillery | 204/192.27 |
| 4,853,257 A | 8/1989 | Henery | 427/166 |
| 4,861,669 A | 8/1989 | Gillery | 428/434 |
| 4,898,789 A | 2/1990 | Finley | 428/623 |
| 4,898,790 A | 2/1990 | Finley | 428/623 |
| 4,900,110 A | 2/1990 | Sleighter | 350/1.7 |

(Continued)

FOREIGN PATENT DOCUMENTS

| | | |
|---|---|---|
| EP | 0275474 | 7/1988 |
| EP | 0536607 A2 | 4/1993 |
| EP | 0877005 A1 | 11/1998 |
| GB | 2302102 | 8/1997 |
| WO | WO01/27050 A1 | 4/2001 |

OTHER PUBLICATIONS

PCT International Search Report dated Nov. 17, 2005, corresponding to International application No. PCT/US2005/011353.
U.S. Appl. No. 10/133,805, filed Apr. 25, 2002.
U.S. Appl. No. 09/058,440, filed Apr. 9, 1998.
U.S. Appl. No. 60/376,000, filed Apr. 25, 2002.
U.S. Appl. No. 10/007,382, filed Oct. 22, 2001.
U.S. Appl. No. 09/512,852, filed Feb. 25, 2000.
U.S. Appl. No. 10/422,095, filed Apr. 24, 2003.
U.S. Appl. No. 10/397,001 filed Mar. 25, 2003.

Primary Examiner—Bruce H. Hess
Assistant Examiner—Lawrence Ferguson
(74) Attorney, Agent, or Firm—Andrew C. Siminerio (57) ABSTRACT

A coating composition that contains at least one degradable coating layer and at least one layer of barrier coating is disclosed. The coating composition can be used to make a coated substrate having improved performance over conventional coated substrates after exposure to heat and certain chemicals like halides such as chlorides, sulfur, salt, chlorine, alkali, and enamels.

48 Claims, 1 Drawing Sheet

U.S. PATENT DOCUMENTS

| | | | |
|---|---|---|---|
| 4,900,633 A | 2/1990 | Gillery | 428/432 |
| 4,902,580 A | 2/1990 | Gillery | 428/623 |
| 4,919,778 A | 4/1990 | Dietrich et al. | 204/192.27 |
| 4,948,677 A | 8/1990 | Gillery | 428/623 |
| 4,952,423 A | 8/1990 | Hirata et al. | 427/109 |
| 4,971,843 A | 11/1990 | Michelotti et al. | 428/34 |
| 5,028,759 A | 7/1991 | Finley | 219/203 |
| 5,059,295 A | 10/1991 | Finley | 204/192.27 |
| 5,110,662 A | 5/1992 | Depauw et al. | 428/192 |
| 5,196,485 A | 3/1993 | McMonigal et al. | 525/327.3 |
| 5,240,886 A | 8/1993 | Gulotta et al. | 501/70 |
| 5,250,146 A | 10/1993 | Horvath | 156/581 |
| 5,286,271 A | 2/1994 | Rueter et al. | 65/106 |
| 5,344,718 A | 9/1994 | Hartig et al. | 428/623 |
| 5,376,455 A | 12/1994 | Hartig et al. | 428/428 |
| 5,385,872 A | 1/1995 | Gulotta et al. | 501/71 |
| 5,393,593 A | 2/1995 | Gulotta et al. | 428/220 |
| 5,425,861 A | 6/1995 | Hartig et al. | 204/192.26 |
| 5,464,657 A | 11/1995 | Athey et al. | 427/255.5 |
| 5,470,526 A * | 11/1995 | Wilfong et al. | 428/36.6 |
| 5,532,180 A | 7/1996 | den Boer et al. | 437/40 |
| 5,536,718 A | 7/1996 | Albright et al. | 514/220 |
| 5,584,902 A | 12/1996 | Hartig et al. | 65/32.4 |
| 5,599,387 A | 2/1997 | Neuman et al. | 106/287.14 |
| 5,653,903 A | 8/1997 | Pinchok, Jr. et al. | 219/203 |
| 5,714,199 A | 2/1998 | Gerhardinger et al. | 427/195 |
| 5,739,213 A | 4/1998 | Freriks et al. | 525/438 |
| 5,811,198 A | 9/1998 | Freriks et al. | 428/482 |
| 5,814,195 A | 9/1998 | Lehan et al. | 204/192.12 |
| 5,820,987 A | 10/1998 | Kaufman et al. | 428/413 |
| 5,821,001 A | 10/1998 | Arbab et al. | 428/623 |
| 5,948,131 A | 9/1999 | Neuman | 65/60.2 |
| 6,010,602 A | 1/2000 | Arbab et al. | 204/192.27 |
| 6,916,542 B2 * | 7/2005 | Buhay et al. | 428/432 |
| 2004/0023080 A1 | 2/2004 | Buhay et al. | |

* cited by examiner

FIG. 1

COATING STACK COMPRISING A LAYER OF BARRIER COATING

CROSS-REFERENCE TO RELATED APPLICATION

This application is a continuation-in-part of U.S. application Ser. No. 10/422,095 filed Apr. 24, 2003, now U.S. Pat. No. 6,962,759 which was a continuation-in-part of U.S. application Ser. No. 10/397,001 filed Mar. 25, 2003, which was a continuation-in-part of U.S. application Ser. No. 10/133,805 filed Apr. 25, 2002, which was a continuation-in-part of U.S. application Ser. No. 10/007,382 filed Oct. 22, 2001 now U.S. Pat. No. 6,869,644. This application also claims the benefits of U.S. Provisional Application Ser. No. 60/376,000 filed Apr. 25, 2002, all of which applications are herein incorporated by reference in their entirety.

FIELD OF THE INVENTION

The present invention relates generally to multi-layer functional coatings; especially such coatings that contain at least one layer of barrier coating.

BACKGROUND OF THE INVENTION

Substrates such as glass are used in a multitude of applications ranging from commercial buildings, homes, automobiles, appliances, etc. The substrates are often coated with functional coatings to obtain the desired performance attributes.

A wide variety of functional coatings are known in the art including, but not limited to, electroconductive coatings, solar control coatings, photocatalytic coatings, low emissivity coatings, transparent conductive coatings, etc. An example of a functional coating is a metallic based high transmittance, low emissivity coating that includes at least one metallic layer(s) sandwiched between layers of dielectric material. Usually, the metallic layer is gold, copper, or silver, and the dielectric material is a metal oxide such as tin oxide, indium oxide, titanium oxide, bismuth oxide, zinc oxide, zirconium oxide or zinc/tin oxide.

For certain applications, it is necessary to heat a substrate coated with a functional coating. For example, a coated glass substrate that will be used as an automotive windshield may need to be heated to bend the glass. Typically, glass will be heated for 20–30 minutes to a maximum temperature of 1150° F. to 1200° F. to accomplish the necessary bending for an automotive windshield. Depending on the complexity of the bend, the temperatures could be higher and the duration longer.

Heating a coated substrate can be problematic if the coating contains a layer(s) that will degrade upon heating. Generally, heating a coated substrate will produce beneficial results up to a certain temperature (for a certain duration of time) for various reasons, for example, mobile species becoming mobile upon heating and flowing out of certain coating layers, but then adverse affects arise. The combination of temperature and exposure time to which a coating layer can be heated before the performance of the coating starts to degrade is referred to herein as the "heat budget" of the coating. The performance of a coating starts to degrade after its heat budget is exceeded because at least one layer of coating will start to degrade. Every coating layer in a coating stack has a different heat budget that depends on the materials used to make the coating. The heat budget for a coating stack is determined by the layer of coating in the stack with the lowest heat budget at which the layer starts to degrade.

For example, in the high transmission, low emissivity coating as described above, the metallic layer(s) typically has the lowest heat budget in the coating stack. When a glass substrate coated with such a coating is exposed to heating conditions typically associated with bending, e.g. 1150° F. to 1200° F. for a period of 20 to 30 minutes, the metallic layer(s) will degrade. The degradation of the metallic layer(s) can result in a coated substrate with reduced optical and/or solar control properties. Specifically, the functional coating can demonstrate increased electrical resistivity, increased haze, decreased solar infrared (IR) reflectance, decreased visible light transmittance, increased emissivity, etc.

In addition to heating, other things can cause degradation of layers in a functional coating, such as exposure to certain chemicals including, but not limited to halides such as salt, chlorides, sulfur, chlorine, alkali, and enamels.

To ensure optimal performance of a coated substrate, it is desirable to protect any degradable coating layer(s) in a coating stack from conditions and/or substances that would result in degradation of the coating layer and subsequent decreased performance of the coated substrate. Conventionally, sacrificial layers like primer layers (also known as "blocker layers") have been added to coating stacks, such as metallic based high transmission, low emissivity coatings, or applied at thicker levels to protect a degradable layer(s). The sacrificial layers preferentially respond to or react with the undesirable condition so as to protect other selected layers in the coating stack. The problem with adding a primer layer(s) or using a thicker layer(s) of primer is that after the coating is heated, excess primer can lead to poor adhesion due to failure at the interfaces of individual layers of coating and increased haze. Also, excess primer can make the coating soft and susceptible to damage by rubbing.

The present invention provides a coating composition having at least one layer of barrier coating to protect any degradable layer(s) in the coating stack. Coating compositions according to the present invention exhibit an increased heat budget and improved ability to withstand chemical corrosion.

SUMMARY OF THE INVENTION

In one non-limiting embodiment, the present invention is a coating composition comprising at least one degradable layer and at least one layer of barrier coating, wherein the layer of barrier coating has a permeability to oxygen no greater than 10 grams per m$^2$ per day at a temperature of 900° F.

In another non-limiting embodiment, the present invention is a coated substrate comprising a coating composition applied on at least a portion of the substrate comprising at least one degradable layer and at least one layer of barrier coating, wherein the layer of barrier coating has a permeability to oxygen no greater than 10 grams per m$^2$ per day at a temperature of 900° F.

In yet another non-limiting embodiment, the present invention is a method of forming a multilayered coated substrate comprising applying a degradable coating layer on a substrate and applying a layer of barrier coating on the degradable coating layer, wherein the barrier coating layer has a permeability of to oxygen of no greater than 10 grams per m$^2$ per day at a temperature of 900° F.

DESCRIPTION OF THE INVENTION

As used herein, spatial or directional terms, such as "left", "right", "inner", "outer", "above", "below", "top", "bottom", and the like, are understood to encompass various alternative orientations and, accordingly, such terms are not to be considered as limiting.

Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1.0 to 3.8, 6.6 to 9.7, and 5.5 to 10.0.

As used herein, the terms "on", "applied on/over", "formed on/over", "deposited on/over", "overlay" and "provided on/over" mean formed, deposited, or provided on but not necessarily in contact with the surface. For example, a coating layer "formed over" a substrate does not preclude the presence of one or more other coating layers of the same or different composition located between the formed coating layer and the substrate. For instance, the substrate (e.g. glass or ceramic) can include a conventional coating such as those known in the art for coating substrates.

The present invention is a coating composition that comprises at least one layer of barrier coating and at least one layer of coating that is susceptible to degradation upon exposure to certain conditions such as, but not limited to, heat and chemical attack. The layer of coating that is susceptible to degradation is referred to herein as the "degradable layer".

The layer of barrier coating according to the present invention can be a single layer or multiple layers of coating. The layer of barrier coating can serve as a barrier against various materials such as, but not limited to, oxygen, copper, halides, sulfides, sulfur, alkali, water, etc. The layer of barrier coating of the present invention is substantially stable, substantially non-consumable, and substantially non-reactive. By substantially stable, substantially non-consumable, and substantially non-reactive, it is meant that the stoichiometric ratio of the components in the barrier layer to $O_2$ will not change more than plus or minus 5%. Regardless of the conditions the layer of barrier coating is exposed to, it will remain essentially the same compositionally. For example, in the case of an oxygen barrier coating, if the layer of barrier coating starts fully oxidized, it will remain fully oxidized regardless of the conditions.

According to the present invention, when the layer of barrier coating is protecting the degradable layer from oxygen, the layer of barrier coating has a low permeability to oxygen. In a non-limiting embodiment of the invention, the layer of barrier coating exhibits a permeability to oxygen of no greater than 10 grams per $m^2$ per day at a temperature of 900° F., for example, no greater than 8 grams per $m^2$ per day or no greater than 5 grams per $m^2$ per day.

The following illustrates how permeability to oxygen can be measured. Three clear pieces of glass were coated with a 1400 Å thick first layer of barrier coating comprising an alloy of alumina and silica (60 weight % alumina and 40 weight % silica). Next, a coating comprising a 114 Å layer of titanium was applied over the layer of alumina/silica alloy. Lastly, the samples were coated with a second layer of barrier coating comprising an alloy of alumina and silica (60 weight % alumina and 40 weight % silica). The thickness of the second barrier layer was different for each sample. One sample (Sample A) had a second barrier layer having a thickness of 266 Å. Another sample (Sample B) had a second barrier layer coating having a thickness of 515 Å. The last sample (Sample C) had a second barrier layer having a thickness of 1,071 Å. Initially, all the samples appeared dark on transmission as a result of the absorption of the titanium layers.

After the samples were prepared, each sample was heated at 1300° F. The amount of time it took for the samples to become clear (no absorption) was recorded. When a sample becomes clear, that indicates that the titanium that was initially deposited has fully oxidized and become titania. Sample A took 80 minutes to fully oxidize. Sample B took 115 minutes to fully oxidize. And, Sample C took 130 minutes to fully oxidize. The recorded "oxidation" times were used to calculate permeabilities (P) using the following equation:

$$P = T/10E^8 \text{ [Å/cm]} \times 4.5 \text{ [g/cm}^3\text{]} \times 10E4 \text{ [cm}^2/m^2\text{]}/47.9 \text{ [g/mol]} \times 32 \text{ [g/mol]}/R \times 1440 \text{ [min/day]}$$

where
T=thickness of titanium layer [Å];
4.5 $g/cm^3$=density of titanium;
47.9 g/mol=atomic weight of titanium;
32 g/mol=molecular weight of $O_2$; and
R=recorded oxidation time in minutes.

The permeability of Sample A was calculated to be 0.6 grams per $m^2$ per day. The permeability of Sample B was calculated to be 0.4 grams per $m^2$ per day. And, the permeability of Sample C was calculated to be 0.4 grams per $m^2$ per day.

According to the present invention, the layer of barrier coating can have an index of refraction equal to any value at 550 nm. When the layer of barrier coating is comprised of multiple layers, the index of refraction of the entire layer of barrier coating can be calculated using standard techniques which are well known in the art. In a non-limiting embodiment, the entire layer of barrier coating has an index of refraction equal to 3 or less, for example 2.5 or less, or 1.8 or less.

In a non-limiting embodiment of the invention, the layer of barrier coating is a single layer comprised of one or more metal oxide materials such as but not limited to, alumina, silica, or mixtures thereof. For example, the layer of barrier coating can be made up entirely of alumina or entirely of silica. In another non-limiting embodiment, the layer of barrier coating can be a combination of alumina and silica, for example, but not limited to, 5 weight percent to 95 weight percent alumina and 95 weight percent to 5 weight percent silica, or 10 weight percent to 90 weight percent alumina and 90 weight percent to 10 weight percent silica, or 15 weight percent to 90 weight percent alumina and 85 weight percent to 10 weight percent silica, or 50 weight percent to 75 weight percent alumina and 50 weight percent to 25 weight percent silica.

In a non-limiting embodiment of the invention, the layer of barrier coating comprises a single layer and the composition of the barrier coating varies throughout. For example, the barrier coating composition can be comprised of two materials; a first material and a second material. The layer of barrier coating is applied on a substrate in such a manner that the concentration of the first material of the barrier coating is greatest near the substrate and the concentration of second material of the barrier coating increases, for example, gradually, as the distance from the substrate increases. The composition of the barrier coating furthest from the substrate has the greatest concentration of the second material. In another non-limiting embodiment of the invention, the barrier coating is a single layer and the composition of the barrier coating is generally uniform throughout.

In a non-limiting embodiment of the invention, the thickness of the layer of barrier coating can range up to 2 microns (20,000 Å), for example, from 50 Å to 5,400 Å, or from 85 Å to 600 Å.

In a non-limiting embodiment of the invention where the layer of barrier coating is comprised of multiple layers, the barrier coating comprises a first layer of silica and/or alumina applied over a second layer of silica and/or alumina. For example, the first layer can comprise alumina or a silica/alumina mixture having greater than 5 weight percent alumina, for example, greater than 10 weight percent alumina, or greater than 15 weight percent alumina. The first layer can have a thickness up to 1 micron, for example, from 50 Å to 400 Å, or from 60 Å to 300 Å. The second layer can comprise a silica/alumina mixture having greater than 40 weight percent silica, for example, greater than 50 weight percent silica, or greater than 60 weight percent silica. The second layer can have a thickness up to 1 micron, for example, from 50 Å to 5,000 Å, or from 60 Å to 300 Å. Each of the layers that comprise the layer of barrier coating can have a uniform composition or a composition that varies throughout.

According to the present invention, the layer of barrier coating can be incorporated into any functional coating known in the art. In a non-limiting embodiment of the invention, the layer of barrier coating is incorporated into a metal based coating composition. As used herein, metal based coating composition includes any coating that contains at least one layer of metal. Specifically, the layer of barrier coating can be incorporated into a metal based coating composition comprising one or more layers of a unit metal based coating stack which is described in detail below. The unit metal based coating stack can be repeated any number of times to produce a cascade design as is well known in the art.

The unit metal based coating stack comprises a first layer of dielectric material, a layer of electromagnetic radiation reflective material, a layer of primer, and a second layer of dielectric material. The first layer of dielectric material can be comprised of metal oxides or oxides of metal alloys which are transparent to visible light. Non-limiting examples of suitable metal oxides include indium oxide, titanium oxide, zinc oxide, tin oxide and mixtures and alloys thereof (e.g. zinc stannate). For example, the first layer of dielectric material can comprise an alloy of zinc and tin in proportions ranging from 10 to 90 weight percent zinc, for example, from 30 to 60 weight percent zinc, or from 46 to 50 weight percent zinc. As another example, the first layer of dielectric material can be comprised of multiple layers, e.g., one layer of zinc stannate and another layer of zinc oxide. A suitable first layer of dielectric material is described in U.S. Pat. Nos. 4,610,771 and 5,821,001, which are hereby incorporated by reference.

The thickness of the first layer of dielectric material can range from 100 Å to 800 Å, for example, from 200 Å to 750 Å, or from 280 Å to 700 Å.

A layer of electromagnetic radiation reflective material is applied over at least a portion of the first layer of dielectric material. The electromagnetic radiation reflective material can reflect in the solar infrared region, in the thermal infrared region, and/or in the microwave region. The electromagnetic radiation reflective material can comprise a metal such as gold, copper, or silver. The electromagnetic radiation reflective material can also comprise a combination of the aforementioned metals as well as alloys thereof. In the described unit metal based coating stack, the layer of electromagnetic radiation reflective material is the degradable layer.

The thickness of the layer of electromagnetic radiation reflective material can range from 50 Å to 300 Å, for example, from 60 Å to 200 Å, or from 70 Å to 150 Å.

A layer of primer is applied over at least a portion of the layer of electromagnetic radiation reflective material. The layer of primer can be any material known in the art as a getteringiscavenging material, i.e., a material that readily absorbs a gas. Suitable materials for the primer include, but are not limited to, titanium, copper, aluminum, nickel, niobium, yttrium, zirconium, hafnium, chromium, and alloys thereof; nickel-chromium alloy and cobalt-chromium alloy; sub-oxides such as indium tin sub-oxide, titanium sub-oxide, and zinc aluminum sub oxide; and nitrides such as silicon nitride.

In a non-limiting embodiment of the invention, the layer of primer can convert from a metal to an oxide or from a sub-oxide to an oxide due to, for example, exposure to an $O_2$ containing plasma or as a resulting of being heated in air. The fact that the primer may lose its ability as a getterer/scavenger over time does not affect its classification as a primer. For example, a coating stack according to the present invention can contain a layer of primer initially comprised of titanium metal. Over time, as the layer of titanium metal absorbs oxygen, the titanium metal will convert to titania, i.e. $TiO_2$. Titania does not further react with oxygen. In such case, the titania that was initially present in the coating stack as titanium metal is considered the layer of primer.

The thickness of the layer of primer can range up to 50 Å, for example from 5 Å to 35 Å, or from 8 Å to 30 Å, or from 10 Å to 18 Å.

A second layer of dielectric material is applied over at least a portion of the layer of primer. Suitable materials for the second layer of dielectric material and the thickness of the applied layer are as described above for the first layer of dielectric material.

The layer of barrier coating can be applied anywhere within a coating composition comprised of one or more the unit metal based coating stacks described above. In a non-limiting embodiment of the invention, the coating composition includes a single unit metal based coating stack and a layer of barrier coating is applied over the second layer of dielectric material. In another non-limiting embodiment of the invention, the coating composition includes a single unit metal based coating stack and a layer of barrier coating is applied over the first layer of dielectric material. In yet another non-limiting embodiment of the invention, a layer of barrier coating is applied on the substrate and a single unit metal based coating stack is applied over the layer of barrier coating.

In another non-limiting embodiment of the invention, at least one layer of barrier coating is incorporated anywhere in a coating composition that repeats the unit metal based coating stack described above at least two times, e.g. three times wherein the coating stack comprises three layers of electromagnetic radiation reflective material. In a particular embodiment, the coating composition includes three unit metal based coating stacks and a layer of barrier coating is the last layer of coating, i.e., it is applied on at least a portion of the second layer of dielectric material of the third unit metal based coating stack. In another specific embodiment, two layers of barrier coating are included with a layer of barrier coating forming the first and last layer of the coating stack.

In various non-limiting embodiments of the invention, other coating layers comprised of various materials can be applied over the layer of barrier coating; particularly when the layer of barrier coating is the last coating layer in a coating stack. In one non-limiting embodiment of the invention, a layer of titanium metal is applied over the layer of barrier coating. In another non-limiting embodiment, a layer of carbon is applied over the layer of barrier coating. Applying a dark, heat absorbing layer of coating like carbon over the layer of barrier coating, can increase the heating rate of the coated substrate.

In another non-limiting embodiment of the present invention, the layer of barrier coating is incorporated into a coating stack comprising at least the following layers: at least one layer of a transparent, conductive oxide, e.g., fluorine doped tin oxide, indium tin oxide, or zinc aluminum oxide, and at least one layer of a conductive nitride, like titanium nitride or zirconium nitride. The arrangement of the layer of a conductive nitride and layer of transparent, conductive oxide is immaterial, i.e., the layer of conductive nitride can be applied on at least a portion of the layer of transparent, conductive oxide and vice versa. In this embodiment, the layer of barrier coating can be the first and/or last coating in the stack.

In the coating stack described above, the layer of conductive nitride is the degradable layer.

The thickness of the layer of transparent, conductive oxide can range from 1 Å to 5,000 Å, for example, from 5 Å to 2,500 Å. The thickness of the layer of conductive nitride can range from 1 Å to 2,500 Å, for example, from 5 Å to 1,000 Å, or from 10 Å to 500 Å.

In addition to the various coating compositions, the present invention encompasses methods for making the coatings. Specifically, the present invention encompasses a method of forming a multilayered coated substrate comprising applying a degradable coating layer on a substrate and applying a layer of barrier coating on the degradable coating layer, wherein the barrier coating layer has a permeability to oxygen of no greater than 10 grams per $m^2$ per day at a temperature of 900° F. The layer of barrier coating can be the last layer in the coating stack or it can be placed within a coating stack. In a non-limiting embodiment, the present invention further comprises applying additional coating layers on the degradable coating layer prior to applying the barrier layer coating. In another non-limiting embodiment, the present invention further comprises applying another layer of barrier coating on the substrate prior to applying the degradable coating layer.

The various layers of coating discussed above can be applied using conventional techniques such as chemical vapor deposition ("CVD"), spray pyrolysis, and magnetron sputtered vacuum deposition ("MSVD").

Suitable CVD methods of deposition are described in the following references, which are hereby incorporated by reference: U.S. Pat. Nos. 4,853,257; 4,971,843; 5,536,718; 5,464,657; 5,599,387; and 5,948,131.

Suitable spray pyrolysis methods of deposition are described in the following references, which are hereby incorporated by reference: U.S. Pat. Nos. 4,719,126; 4,719,127; 4,111,150; and 3,660,061.

Suitable MSVD methods of deposition are described in the following references, which are hereby incorporated by reference: U.S. Pat. Nos. 4,379,040; 4,861,669; and 4,900,633. In a non-limiting embodiment of the invention where MSVD is used to deposit the layer of barrier coating, a target comprising 60 weight percent aluminum and 40 weight percent silicon can be sputtered to deposit a layer of barrier coating comprising a mixture, alloy, or combination of alumina and silica.

The multi-layer coating composition of the present invention can be applied on various substrates. Examples of suitable substrates include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane containing polymers; or copolymers of any monomers for preparing these, or any mixtures thereof; metal substrates, such as but not limited to steel, galvanized steel, stainless steel, and aluminum; ceramic substrates; tile substrates; glass substrates; or mixtures or combinations of any of the above. For example, the substrate can be conventional untinted soda-lime-silica-glass, i.e., "clear glass", or can be tinted or otherwise colored glass, borosilicate glass, leaded glass, tempered, untempered, annealed, or heat-strengthened glass. The glass can be of any type, such as conventional float glass or flat glass, and can be of any composition having any optical properties, e.g., any value of visible radiation transmission, ultraviolet radiation transmission, infrared radiation transmission, and/or total solar energy transmission. Types of glass suitable for the practice of the invention are described, for example but not to be considered as limiting, in U.S. Pat. Nos. 4,746,347; 4,792,536; 5,240,886; 5,385,872; and 5,393,593.

The substrate can be any thickness. In the embodiment wherein the substrate is glass, generally, the substrate is thicker for architectural applications than for automotive applications. In a non-limiting embodiment for an architectural application, the substrate can be glass having a thickness ranging from 1 mm to 20 mm, for example, 1 mm to 10 mm, or 2 mm to 6 mm. In a non-limiting embodiment for an automotive application, the substrate can be at least one glass ply in a laminated automotive windshield or sidelight, and the substrate can be up to 5.0 mm thick, for example, up to 4.0 mm, or up to 3.0 mm, or up to 2.5 mm thick, or up to 2.1 mm thick.

When the substrate is glass, the glass can be manufactured using conventional float processes, e.g., as described in U.S. Pat. Nos. 3,083,551; 3,220,816; and 3,843,346 which are hereby incorporated by reference. In a non-limiting embodiment of the invention, the coating layers as discussed herein can be applied to the glass during the float glass process, e.g., while the glass is being supported on molten tin within a float bath.

In a non-limiting embodiment, the present invention encompasses the coated substrate described below. A first dielectric layer comprised of zinc stannate is deposited on a substrate at a thickness from 250 Å to 490 Å, for example, from 340 Å to 440 Å, or 375 Å to 425 Å. A first silver layer is deposited on the first dielectric layer at a thickness from 50 Å to 175 Å, for example, from 60 Å to 125 Å, or from 67 Å to 90 Å. A first titanium primer layer is deposited on the first silver layer at a thickness from 10 Å to 30 Å, for example, from 12 Å to 25 Å, or from 15 Å to 22 Å. A second zinc stannate dielectric layer is deposited on the first primer layer at a thickness from 600 Å to 800 Å, for example, from 650 Å to 750 Å or from 675 Å to 725 Å. A second silver layer is deposited on the second dielectric layer at a thickness from 50 Å to 175 Å, for example, from 60 Å to 125 Å, or from 67 Å to 90 Å. A second titanium primer layer is deposited on the second dielectric layer at a thickness from 10 Å to 30 Å, for example, from 12 Å to 25 Å, or from 15 Å to 22 Å. A third zinc stannate dielectric layer is deposited on the second primer layer at a thickness from 290 Å to 490 Å, for example, from 340 Å to 440 Å, or 375 Å to 425 Å. A barrier layer comprised of a mixture, alloy, or combination of alumina and silica having 60 weight percent alumina to 40 weight percent silicon is deposited on the third dielectric layer at a thickness ranging from 100 Å to 600 Å, for example, from 150 Å to 500 Å, or from 175 Å to 400 Å. A layer of titania having a thickness ranging from 100 Å to 600 Å, for example, from 150 Å to 500 Å, or from 175 Å to 400 Å is deposited over the alumina/silica layer to provide additional durability to the coating.

Coated substrates according to the present invention can be used for various applications such as but not limited to, automotive transparencies, automotive sidelights, windshields, backlights, sun or moon roofs, and insulated glass units for residential or commercial windows, oven doors for gas, electric and microwave ovens.

A substrate coated with the coating according to the present invention demonstrates superior performance over conventionally coated substrates. For example, a coated substrate according to the invention will generally have better performance in terms of electrical resistivity, haze, solar IR reflectance, visible light transmission, etc. after it is heated during product manufacturing, specifically the type of heating associated with bending a piece of glass to produce an automotive windshield or tempering a glass sheet, because the degradable layer(s) remain in tact. Also, when a layer of barrier coating is the last coating layer in a coating stack, a coated substrate according to the present invention is better able to withstand mechanical and/or chemical attack during handling, transport, and storage. Further, the coating stack has better mechanical durability, chemical durability and heat stability during use such as in a microwave oven door.

The present invention also encompasses a method for creating an enclosed system within a multi-layer coating by incorporating at least one layer of barrier coating in a coating stack. The barrier layer can be incorporated anywhere in the coating stack, i.e., within individual layers of the unit metal based coating stack and/or between unit metal based coating stacks. The enclosed system refers to the region between two layers of barrier coating or between a layer of barrier coating and the substrate. Within the enclosed system, essentially no material can enter or leave. The material that can flow through the enclosure is defined in terms of permeability which is described above.

The method of the present invention enables the interactions between layers of coating within a coating stack to be manipulated so that only the desired interactions can occur. Other layers of functional coating or other materials such as $O_2$ outside of the enclosed system are restricted from coming in contact and react with layers within the enclosed system.

The method of the present invention is particularly beneficial when a coating stack contains a layer(s) that should not be exposed to certain materials. For example, a coating stack might comprise a metallic layer, like silver, that would degrade if it were exposed to oxygen. In such case, the method of the invention can be used to create an enclosed, region without ambient $O_2$ around the metallic layer by applying a layer of barrier coating both under and above the metallic layer or applying a layer of barrier coating above the metallic layer and utilizing the substrate before the metallic layer as the other oxygen barrier.

The following example highlights the benefits of the present invention. A substrate is coated with a multilayered coating composition comprising three base stacks similar to those described above. The coating stack is formed via MSVD and the entire coating comprises three layers of silver, four layers of dielectric material (the second dielectric layer of the first base stack combines with the first dielectric layer of the second base stack to form a single dielectric layer, and the second dielectric layer of the second base stack combines with the first dielectric base stack of the third unit metal based coating stack to form another single dielectric layer), and three layers of primer. The layers of dielectric material sandwich the silver layers. A layer of primer is applied on a layer of silver before a layer of dielectric is applied. The layer of barrier coating is applied over the fourth layer of dielectric material in the coating stack. The layer of barrier coating creates an enclosed region between the layer of barrier coating and the substrate. Consequently, the only oxygen that has to be accounted for in the design of the coating stack is the oxygen contained within the system when the coating stack is being formed as a result of, for example, deposition of a dielectric layer via MSVD in an oxygen environment. External oxygen is irrelevant because the coating stack is an enclosed system.

As a result of the invention, the layers of primer can be the minimum thickness required to protect the layer(s) of degradable material, e.g. silver, during deposition of the overlaying dielectric layer. Furthermore, less primer than currently taught in the art protect the layer(s) of degradable material, e.g., silver, during any heating steps that are required to bend the coated substrate to a desired contour or to temper coated glass because ambient $O_2$ is restricted in the system. As mentioned above, after heating, excess primer can lead to failure at the interfaces of individual layers of coating.

It has been found that in the stack configuration, the primer layer can be as thin as 12 Å. That is half the thickness required for a similar coating configuration without a layer of barrier coating that must be able to withstand the deposition process and heating conditions required for bending or tempering the substrate.

Because the present invention allows thinner layers of primer to be utilized in the described coating stack, new materials can be used as the primer. More specifically, previously certain materials couldn't be used because the primer layers had to be so thick that there was a risk the layers might not fully oxidize and could form an alloy with the silver upon heating can be used with the present invention. Such materials include, but are not limited to, aluminum, hafnium, and cobalt-chrome alloy.

The present invention will be illustrated by the following non-limiting examples.

EXAMPLES

Figure 1:
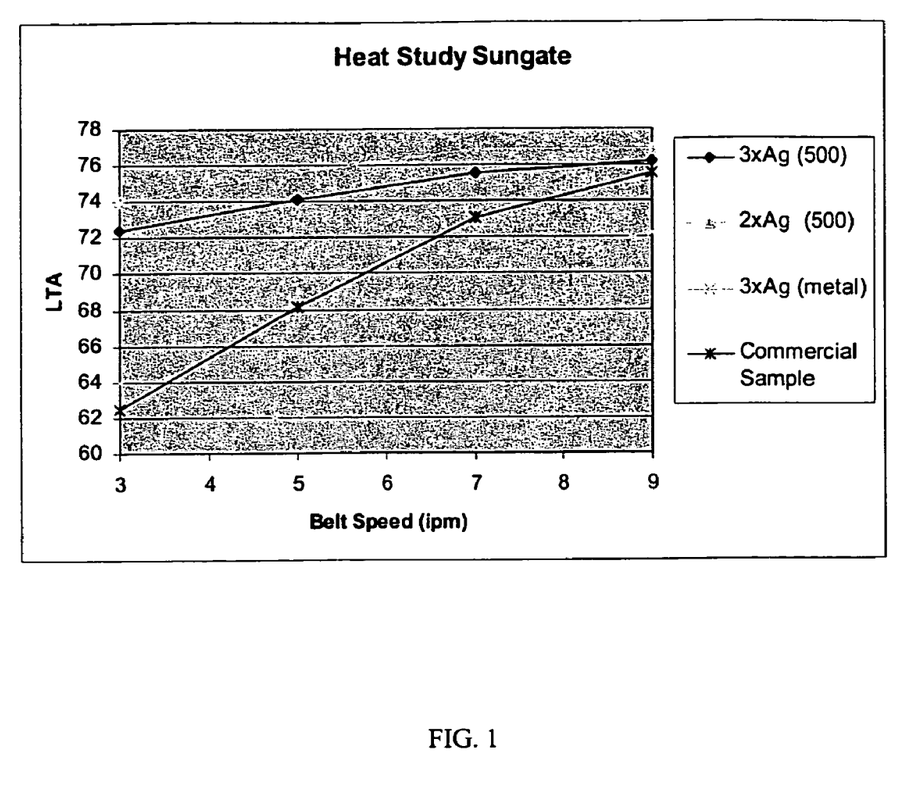
FIG. 1 shows a heat study conducted on several coated substrates incorporating features of the present invention.

FIG. 1 shows a heat study that was conducted in the following manner. Glass substrates were prepared in the following manner: a 3 inches×6 inches×0.08 inch piece of clear float glass was coated with the coating facing up on a conveyor belt of a production MSVD coater from Von Ardenne. Two, 3 inches×3 inches×0.08 inch clear glass sheets were placed on top of the coated glass to cover the coating. The laminate was passed through a Lindberg furnace having five zones. Each zone was 10 inches long. As described from the entrance of the furnace, the first zone was at a temperature of approximately 1350° F., the second zone was at a temperature of approximately 1130° F., the third zone was at a temperature of approximately 1180° F., the fourth zone was at a temperature of approximately 1205° F., and the fifth zone was at a temperature of approximately 1195° F.

The exemplary coated substrates were run through the furnace at various speeds. Upon leaving the furnace, the 3 inches×3 inches glass sheets on top of the coated glass were removed and a 0.03 inch thick sheet of polyvinylbutyral (PVB) was placed over half of the coated glass substrate. The PVB was then covered with one of the 3 inches×3 inches×0.09 inch glass sheets that was previously removed to form a laminate over one half of the coated glass. The visible light transmittance (LTA) of the laminated half of the coated glass sheet was measured using illuminant A.

It should be appreciated that the slower the belt speed, the longer the coated glass was exposed to oven conditions, and the hotter the coated substrate became. The belt speed is related to heat budget. More specifically, the slower the belt speed, the longer a coating will be exposed to high temperatures, and the higher heat budget the coating will have to withstand to exhibit good performance.

In the heat study, all of the coatings were applied on a 3 inches×6 inches×2.1 mm clear float glass sheet. The designations for the exemplary coated substrates is described below. The coated substrate designated "3×Ag(500)" was made in the following manner: a first layer of zinc stannate was applied on the substrate at a thickness of 390 Å; a first layer of silver was applied on the first layer of zinc stannate at a thickness of 75 Å; a first layer of titanium metal was applied on the first layer of silver at a thickness of 15 Å; a second layer of zinc stannate was applied on the first layer of titanium metal at a thickness of 690 Å; a second layer of silver was applied on the second layer of zinc stannate at a thickness of 75 Å; a second layer of titanium metal was applied on the second layer of silver at a thickness of 15 Å; a third layer of zinc stannate was applied on the second layer of titanium metal at a thickness of 690 Å; a third layer of silver was applied on the third layer of zinc stannate at a thickness of 75 Å; a third layer of titanium metal was applied on the third layer of silver at a thickness of 15 Å; a fourth layer of zinc stannate was applied on the third layer of titanium at a thickness of 390 Å; and a layer of barrier coating comprised of an alloy of alumina and silica sputtered from a target comprising 60 weight percent aluminum and 40 weight percent silicon was applied on the fourth layer of dielectric material at a thickness of 500 Å.

The coated substrate designated "3×Ag(metal)" was made in the following manner: a first layer of zinc stannate was applied on the substrate at a thickness of 390 Å; a first layer of silver was applied on the first layer of zinc stannate at a thickness of 75 Å; a first layer of titanium metal was applied on the first layer of silver at a thickness of 15 Å; a second layer of zinc stannate was applied on the first layer of titanium metal at a thickness of 690 Å; a second layer of silver was applied on the second layer of zinc stannate at a thickness of 75 Å; a second layer of titanium metal was applied on the second layer of silver at a thickness of 15 Å; a third layer of zinc stannate was applied on the second layer of titanium metal at a thickness of 690 Å; a third layer of silver was applied on the third layer of zinc stannate at a thickness of 75 Å; a third layer of titanium metal was applied on the third layer of silver at a thickness of 15 Å; a fourth layer of zinc stannate was applied on the third layer of titanium metal having a thickness of 100 Å; and a layer of titanium metal was applied on the fourth layer of zinc stannate at a thickness of 26 Å.

The coated substrate designated "2×Ag(500)" was made in the following manner: a first layer of zinc stannate was applied on the substrate at a thickness of 390 Å; a first layer of silver was applied the first layer of zinc stannate at a thickness of 75 Å; a first layer of titanium metal was applied on the first layer of silver at a thickness of 15 Å; a second layer of zinc stannate was applied on the first layer of titanium metal at a thickness of 690 Å; a second layer of silver was applied on the second layer of zinc stannate at a thickness of 75 Å; a second layer of titanium metal was applied on the second layer of silver at a thickness of 15 Å; a third layer of zinc stannate was applied on the second layer of titanium metal at a thickness of 390 Å; and a layer of barrier coating comprised an alloy of alumina and silica sputtered from a target comprising 60 weight percent aluminum and 40 weight percent silicon was applied on the third layer of zinc stannate at a thickness of 500 Å.

A commercial sample is included in FIG. 1. In this sample, a glass substrate was coated with Sungate® Automotive Coating Number 5 ("SA05") which is commercially available from PPG Industries in Pittsburgh, Pa. SA05 is a double silver layer, heatable coating.

CONCLUSION

As shown in the heat study of FIG. 1, the barrier coating of the present invention protects the degradable layer(s) and thereby maintains the performance of the coating. Coated substrates having a 500 Å layer of barrier coating according to the present invention—"3×Ag(500)" and "2×Ag(500)"-maintained a fairly constant LTA regardless of the belt speed. The example identified as 3×Ag(500) showed a drop in LTA from 77% to 74% as the belt speed dropped from 9 ipm to 3 ipm. The example identified as 2×Ag(500) showed a drop in LTA from 76% to 72% as the belt speed dropped from 9 ipm to 3 ipm. Because "3×Ag(500)" and "2×Ag (500)" contain primers layers at a thickness of 15 Å, the reduction in LTA due to a reduction in belt speed is much less than expected.

Substrates that did not have a layer of barrier coating according to the present invention showed more severe drop-offs in regards to LTA with slower belt speeds than substrates coated according to the present invention. The example identified as 3×Ag(metal) showed a drop in LTA from 75% to 62% as the belt speed dropped from 9 ipm to 3 ipm. The results show titanium does not have as good barrier properties as the layer of barrier coating described in the present invention. The commercial sample showed a drop in LTA from 72% to 61% as the belt speed dropped from 9 ipm to 5 ipm and then the LTA increased from 61% to 64% as the belt speed dropped from 5 ipm to 3 ipm.

It will be readily appreciated by those skilled in the art that modifications can be made to the invention without departing from the concepts disclosed in the foregoing description. Such modifications are to be considered as included within the scope of the invention. Accordingly, the particular embodiments described in detail hereinabove are illustrative only and are not limiting as to the scope of the invention, which is to be given the full breadth of the appended claims and any and all equivalents thereof.

What is claimed is:

1. A coating composition, on a substrate, wherein the composition comprises:
   a functional coating comprising an inner layer and an outer layer;
   at least one degradable layer located between the inner layer and the outer layer; and
   at least one layer of barrier coating located between the inner layer and the outer layer,
   wherein the at least one layer of barrier coating has a permeability to oxygen no greater than 10 grams per $m^2$ per day at a temperature of 900° F.

2. A coating composition according to claim 1, wherein the at least one layer of barrier coating is a single layer comprising one or more metal oxide materials selected from aluminum oxide, silicon oxide, and mixtures thereof.

3. A coating composition according to claim 2, wherein the at least one layer of barrier coating comprises a mixture, alloy, or combination of alumina and silica sputtered from a target comprising 60 weight percent aluminum and 40 weight percent silicon.

4. A coating composition according to claim 2 wherein the at least one layer of barrier coating has a thickness of up to 2 microns.

5. A coating composition according to claim 1 wherein the at least one layer of barrier coating is a multi-layer coating comprising a first layer selected from silica, alumina, and mixtures thereof, applied over a second layer selected from silica, alumina, and mixtures thereof.

6. A coating composition according to claim 1, wherein the at least one degradable layer is an electromagnetic radiation reflective material selected from gold, copper, silver, conductive nitride, and mixtures of.

7. A coating composition according to claim 6, wherein the at least one degradable layer is silver.

8. A coating composition according to claim 7, wherein the coating composition further comprises first and second layers of dielectric material and at least one layer of primer, and further wherein the degradable layer is on at least a portion of the first layer of dielectric material; the at least one layer of primer is on at least a portion of the degradable layer; the second layer of dielectric material is on at least a portion of the at least one layer of primer; and the at least one layer of barrier coating is on at least a portion of the second layer of dielectric material.

9. A coating composition according to claim 8 wherein the first and second layers of dielectric material are each selected from indium tin oxide, titanium oxide, zinc oxide, tin oxide and mixtures and alloys thereof.

10. A coating composition according to claim 8 wherein the first and second layers of dielectric material each have a thickness ranging from 100 Å to 800 Å.

11. A coating composition according to claim 8, wherein the layer of electromagnetic radiation reflective material has a thickness ranging from 50 Å to 300 Å.

12. A coating composition according to claim 8, wherein the at least one layer of primer has a thickness ranging from 10 Å to 30 Å.

13. A coating composition according to claim 12, wherein the at least one layer of primer is selected from titanium, copper, aluminum, niobium, yttrium, zirconium, hafnium, chromium, and mixtures and alloys thereof; nickel-chromium alloy; cobalt-chromium alloy; indium tin sub-oxide; titanium sub-oxide; zinc aluminum sub oxide; silicon nitride and mixtures thereof.

14. A coating composition according to claim 6, wherein the degradable layer is a layer of conductive nitride.

15. A coating composition according to claim 14, wherein the coating composition further comprises a layer of transparent conductive oxide.

16. A coating composition according to claim 15, wherein the at least one degradable layer is on at least a portion of the layer of transparent conductive oxide and the at least one layer of barrier coating is on at least a portion of the at least one degradable layer.

17. A coating composition according to claim 15, wherein the layer of transparent, conductive oxide is on at least a portion of the at least one degradable layer and a layer of barrier coating is on at least a portion of the layer of transparent, conductive oxide.

18. A coating composition according to claim 16, wherein the transparent conductive oxide is selected from fluorine doped tin oxide, indium tin oxide, zinc aluminum oxide, and mixtures thereof.

19. A coating composition according to claim 16, wherein the layer of transparent, conductive oxide has a thickness ranging from 1 Å to 2500 Å.

20. A coating composition according to claim 16, wherein the layer of conductive nitride is selected titanium nitride, zirconium nitride, and mixtures thereof.

21. A coating composition according to claim 16, wherein the layer of conductive nitride has a thickness ranging from 10 Å to 500 Å.

22. A coating composition, on a substrate, according to claim 16, wherein the at least one layer of barrier coating has a thickness of at least 100 Å.

23. A coated substrate comprising:
   a substrate;
   a functional coating on at least a portion of said substrate comprising:
   an inner layer and an outer layer;
   at least one degradable layer located between the inner layer and the outer layer; and
   at least one layer of barrier coating located between the inner layer and the outer layer,
   wherein the layer of barrier coating has a permeability to oxygen no greater than 10 grams per $m^2$ per day at a temperature of 900° F.

24. A coated substrate according to claim 23, wherein the at least one layer of barrier coating is a single layer comprised of one or more metal oxide materials selected from aluminum oxide, silicon oxide, and mixtures thereof.

25. A coated substrate according to claim 24, wherein the at least one layer of barrier coating comprises a mixture, alloy, or combination of alumina and silica sputtered from a target comprising 60 weight percent aluminum and 40 weight percent silicon.

26. A coated substrate according to claim 23, wherein the layer of barrier coating has a thickness up to 2 microns.

27. A coated substrate according to claim 24, wherein the at least one degradable layer is an electromagnetic radiation reflective material selected from gold, copper, silver, conductive nitride, and mixtures thereof.

28. A coated substrate according to claim 27, wherein the at least one degradable layer is silver.

29. A coating substrate according to claim 27, wherein the coating further comprises first and second layers of dielectric material and at least one layer of primer and further wherein the first layer of dielectric material overlays at least a portion of the substrate, the at least one degradable layer overlays at least a portion of a first layer of dielectric material, the at least one layer of primer overlay at least a portion of the at least one degradable layer, the second layer of dielectric material overlays at least a portion of the at least one layer of primer, and the at least one layer of barrier coating overlays at least a portion of the second layer of dielectric material.

30. A coated substrate according to claim 29, wherein the first and second layers of dielectric material are each selected from indium oxide, titanium oxide, zinc oxide, tin oxide and mixtures and alloys thereof.

31. A coated substrate according to claim 29, wherein the first and second layers of dielectric material each have a thickness ranging from 100 Å to 800 Å.

32. A coated substrate according to claim 29, wherein the layer of electromagnetic radiation reflective material has a thickness ranging from 50 Å to 300 Å.

33. A coated substrate according to claim 29, wherein the at least one layer of primer has a thickness ranging from 10 Å to 30 Å.

34. A coated substrate according to claim 33, wherein the at least one layer of primer is selected from titanium, copper, aluminum, niobium, yttrium, zirconium, hafnium, chromium, mixtures and alloys thereof; nickel-chromium alloy; cobalt-chromium alloy; indium tin sub-oxide; titanium sub-oxide; zinc aluminum sub oxide; silicon nitride and mixtures thereof.

35. A coated substrate according to claim 27, wherein the at least one degradable layer is a layer of conductive nitride.

36. A coated substrate according to claim 35, wherein the coating further comprises a layer of transparent conductive oxide.

37. A coated substrate according to claim 36, wherein the at least one degradable layer overlays at least a portion of the layer of transparent conductive oxide and the at least one layer of barrier coating overlays at least a portion of the at least one degradable layer.

38. A coated substrate according to claim 37, wherein the transparent conductive oxide is selected from fluorine doped tin oxide, indium tin oxide, zinc aluminum oxide and mixtures thereof.

39. A coated substrate according to claim 37, wherein the layer of transparent conductive oxide has a thickness ranging from 1 Å to 2500 Å.

40. A coated substrate according to claim 36, wherein the layer of conductive nitride is selected from titanium nitride, zirconium nitride, and mixtures thereof.

41. A coated substrate according to claim 37, wherein the at least one degradable layer has a thickness ranging from 10 Å to 500 Å.

42. A coated substrate according to claim 37, wherein the at least one layer of barrier coating has a thickness of at least 100 Å.

43. A coated substrate according to claim 23, wherein the substrate is selected from plastic, metal, ceramic, tile, glass, and combinations thereof.

44. A coated substrate according to claim 43, wherein the substrate is glass.

45. A coated substrate comprising:

a substrate;

a first layer of dielectric material comprising zinc stannate on the substrate;

a first degradable layer comprising silver on at least a portion of the first layer of dielectric material;

a first layer of primer comprising titania on at least a portion of the first degradable layer;

a second layer of dielectric material comprising zinc stannate applied on at least a portion of the first layer of primer;

a second degradable layer comprising silver on at least a portion of the second layer of dielectric material;

a second layer of primer comprising titania on at least a portion of the second degradable layer;

a third layer of dielectric material comprising zinc stannate on at least a portion of the second layer of primer;

a third degradable layer comprising silver on at least a portion of the third layer of dielectric material; and a third layer of primer comprising titania on at least a portion of the third degradable layer;

a fourth layer of dielectric material comprising zinc stannate on at least a portion of the third layer of primer; and a layer of barrier coating comprising a mixture, alloy, or combination of alumina and silica sputtered from a target comprising 60 weight percent aluminum and 40 weight percent silicon on at least a portion of the first, second, or third layer of dielectric material, wherein the layer of barrier coating has a permeability to oxygen no greater than 10 grams per $m^2$ per day at a temperature of 900° F.

46. A coated substrate according to claim 45 wherein the first, second, third and fourth layers of dielectric material have a thickness ranging from 100 Å to 800 Å.

47. A coated substrate according to claim 45 wherein the first, second and third layers of primer have a thickness ranging from 10 Å to 18 Å.

48. A coated substrate according to claim 45 wherein the first, second and third degradable layers have a thickness ranging from 50 Å to 300 Å.

* * * * *